United States Patent
Park et al.

(10) Patent No.: US 6,794,716 B2
(45) Date of Patent: Sep. 21, 2004

(54) SOI MOSFET HAVING BODY CONTACT FOR PREVENTING FLOATING BODY EFFECT AND METHOD OF FABRICATING THE SAME

(75) Inventors: Sung-bae Park, Kunpo (KR); Jun Kim, Seoul (KR); Eun-han Kim, Suwon (KR); Hee-sung Kang, Seongnam (KR); Young-wug Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/924,787

(22) Filed: Aug. 8, 2001

(65) Prior Publication Data

US 2002/0047158 A1 Apr. 25, 2002

(30) Foreign Application Priority Data

Aug. 11, 2000 (KR) ........................................ 2000-46613
Apr. 13, 2001 (KR) ........................................ 2001-19943

(51) Int. Cl.[7] .................. H01L 27/01; H01L 27/12; H01L 31/0392
(52) U.S. Cl. ................................................ 257/347
(58) Field of Search ................... 257/68, 301–305, 257/905, 347–351, 357

(56) References Cited

U.S. PATENT DOCUMENTS

| | | | | |
|---|---|---|---|---|
| 4,646,123 A | * | 2/1987 | Lynch et al. | 357/42 |
| 5,349,228 A | | 9/1994 | Neudeck et al. | 257/365 |
| 5,475,257 A | * | 12/1995 | Hashimoto et al. | 257/587 |
| 5,804,858 A | * | 9/1998 | Hsu et al. | 257/347 |
| 5,841,170 A | * | 11/1998 | Adan et al. | 257/345 |
| 5,889,293 A | * | 3/1999 | Rutten et al. | 257/74 |
| 6,051,472 A | * | 4/2000 | Abiko et al. | 438/296 |
| 6,091,123 A | | 7/2000 | Krivokapic et al. | 257/412 |
| 6,110,769 A | | 8/2000 | Son | 438/164 |
| 6,121,659 A | * | 9/2000 | Christensen et al. | 257/347 |
| 6,136,655 A | * | 10/2000 | Assaderaghi et al. | 438/289 |
| 6,156,589 A | * | 12/2000 | Noble | 438/149 |
| 6,245,600 B1 | * | 6/2001 | Geissler et al. | 438/149 |
| 6,451,633 B1 | | 9/2002 | Yoshida | 438/151 |
| 6,476,445 B1 | * | 11/2002 | Brown et al. | 257/347 |

FOREIGN PATENT DOCUMENTS

| | | | |
|---|---|---|---|
| DE | 198 57059 | 6/1999 | ........... H01L/27/12 |
| JP | 2000-216400 | 8/2000 | ........... H01L/21/84 |
| WO | WO 96-42112 | 12/1996 | ........... H01L/29/78 |
| WO | WO 99-33115 | 7/1999 | ........... H01L/27/12 |

OTHER PUBLICATIONS

S. Wolf, Silicon Processing for the VLSI Era, 1990, Lattice Press, vol. 2, 318–319.*

* cited by examiner

Primary Examiner—Mary Wilczewski
Assistant Examiner—Monica Lewis
(74) Attorney, Agent, or Firm—Mills & Onello, LLP

(57) ABSTRACT

An SOI MOSFET having a body contact for preventing the floating body effect is provided. The body contact is a trench perforating a body and a buried oxide layer to a semiconductor substrate. The trench is filled with a conductive material to electrically connect the body to the semiconductor substrate. Impurity ions are implanted into a predetermined region of the semiconductor substrate in contact with the lower portion of the body contact to form an ohmic contact. In the SOI MOSFET, an additional metal interconnection line is not needed to supply power to the body. Also, malfunction of a circuit due to stray capacitance of a contact can be prevented.

5 Claims, 6 Drawing Sheets

SOI MOSFET HAVING BODY CONTACT FOR PREVENTING FLOATING BODY EFFECT AND METHOD OF FABRICATING THE SAME

BACKGROUND OF THE INVENTION

1. Field of the Invention

The present invention relates to a method of fabricating a semiconductor device, and more particularly, to a method of fabricating a body contact of a silicon on insulator metal oxide semiconductor field effect transistor (hereinafter, referred to as "SOI MOSFET").

2. Description of the Related Art

Body contacts are intended to prevent the floating body effect in a transistor. The floating body effect is a phenomenon in which the threshold voltage of the transistor varies because the body of the transistor does not have a certain fixed voltage value during operation. The floating body effect is particularly important in MOS analog techniques. A node having a predetermined direct current (DC) voltage is connected to the body of a transistor when designing MOS analog circuits in order to prevent the floating body effect. The low voltage source or the high voltage source of a chip is connected to the body of a transistor depending on the type ($p^-$ type or $n^-$ type) of the body in a digital circuit. Even in the case of SOI MOSFETs, bodies of transistors have predetermined voltages applied so that the body floating effect does not occur.

Hereinafter, the prior art will be described with reference to the attached drawings. Like reference numerals in the drawings denote the same features in the drawings.

FIG. 1 is a plan view of a SOI MOSFET having a body contact according to a conventional trench method. Referring to FIG. 1, the SOI MOSFET includes an external trench isolation ring 11, a body power supply ring 12 having a $p^+$ (p plus) region, a partial trench isolation ring 13 isolated from a peripheral active region, an active region 14, e.g., a drain of a transistor, an active region 15, e.g., a source of the transistor, a gate 16 between the drain and the source, a contact window 17 contacting the power supply ring 12, and a peripheral active region 19.

FIG. 2 is a cross-sectional view of the SOI MOSFET shown in FIG. 1 taken along line X—X. FIG. 2 shows a $p^-$ type semiconductor substrate 20, a buried oxide layer 21 on the $p^-$ type semiconductor substrate 20, $p^-$ type bodies 14 and 15 on the buried oxide layer 21, a partial trench isolation ring 13 around the $p^-$ type bodies 14 and 15, a $p^+$ body power supply ring 12 next to the partial trench isolation ring 13, an external trench isolation ring 11 next to the $p^+$ body power supply ring 12, a gate oxide layer 18 on the $p^-$ bodies 14 and 15, a gate 16 on the gate oxide layer 18, and a peripheral active region 19.

FIG. 3 is a cross-sectional view of the SOI MOSFET shown in FIG. 1 taken along line Y—Y. FIG. 3 shows a $p^-$ type semiconductor substrate 20, a buried oxide layer 21 on the $p^-$ type semiconductor substrate 20, a drain 14 and a source 15 on the buried oxide layer 21, a gate 16 between the drain 14 and the source 15, a gate oxide layer 18 underneath the gate 16, a partial trench isolation ring 13 around the drain 14 and the source 15, a body power supply ring 12, which is next to the partial trench isolation ring 13, for supplying power to a body, i.e., a $p^+$ region, an external trench isolation ring 11, and a $p^-$ region 22 underneath the partial trench isolation ring 13.

Stray capacitance exists at contacts 100 and 110 between the $p^+$ region, i.e., the body contact 12, and the $p^-$ region, i.e., the bodies 14 and 15 of the transistor in the SOI MOSFET shown in FIGS. 1, 2, and 3. Stray capacitance can limit the performance of the transistor, especially, the operating speed and frequency of a circuit. It is not easy to form a metal interconnection line which needs a wide area in view of the layout when a voltage, e.g., ground voltage, must be applied to a body.

SUMMARY OF THE INVENTION

To solve the above problems, it is an object of the present invention to provide an SOI MOSFET that can reduce a floating body effect without stray capacitance at a contact and an additional metal interconnection line supplying power to the contact.

It is another object of the present invention to provide a method fabricating the same.

Accordingly, to achieve the above first object, there is provided a silicon-on-insulator metal oxide semiconductor field effect transistor (SOI MOSFET). The SOI MOSFET includes a semiconductor substrate, a buried oxide layer, a body, a gate oxide layer, a gate, and a body contact. The semiconductor substrate can be a semiconductor wafer. The buried oxide layer is an oxide layer which is formed on the semiconductor substrate. The body is an active region of a transistor which is formed on the buried oxide layer. The gate oxide layer is formed on the body, and the gate is formed on the gate oxide layer. The body contact supplies power to the body to prevent a floating body effect. The body contact is formed by forming a trench perforating an isolation region surrounding the body, the body, and the buried oxide layer and then filling the trench with a conductive material so that the body is electrically connected to the semiconductor substrate.

The conductive material can be formed of one of a metal layer, a tungsten layer, a silicon epitaxial layer and a combination of at least two of the above layers. The gate can be formed of metal or polysilicon The SOI MOSFET further includes a region into which predetermined impurity ions are implanted and generated on the semiconductor substrate in contact with the lower portion of the body contact so that an ohmic contact is formed between the body contact and the semiconductor substrate.

In one embodiment, the trench narrows as the trench deepens. Alternatively, the trench narrows in a step-wise manner as the trench deepens. In accordance with the invention, there is also provided a method of fabricating a SOI MOSFET. In the method, a buried oxide layer is formed on a semiconductor substrate. A silicon body is formed on the buried oxide layer. The silicon body is defined as a channel region, a body contact, an isolation region, a field oxide layer region, a peripheral region, and the isolation region and the field oxide layer are etched. The isolation region is further etched until the buried oxide layer is exposed. Oxide layers are formed in the isolation region and the field oxide layer region. A gate oxide layer is formed on a predetermined region on the body and a gate is formed on the gate oxide layer. The semiconductor substrate is etched from an upper part toward a lower part so that the body and the buried oxide layer are perforated to form a trench. Predetermined impurity ions are implanted into a predetermined region of the semiconductor substrate to form an ohmic contact. The trench is filled with a conductive material.

In one embodiment, the predetermined region of the semiconductor substrate into which the impurity ions are implanted is the bottom of the trench.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
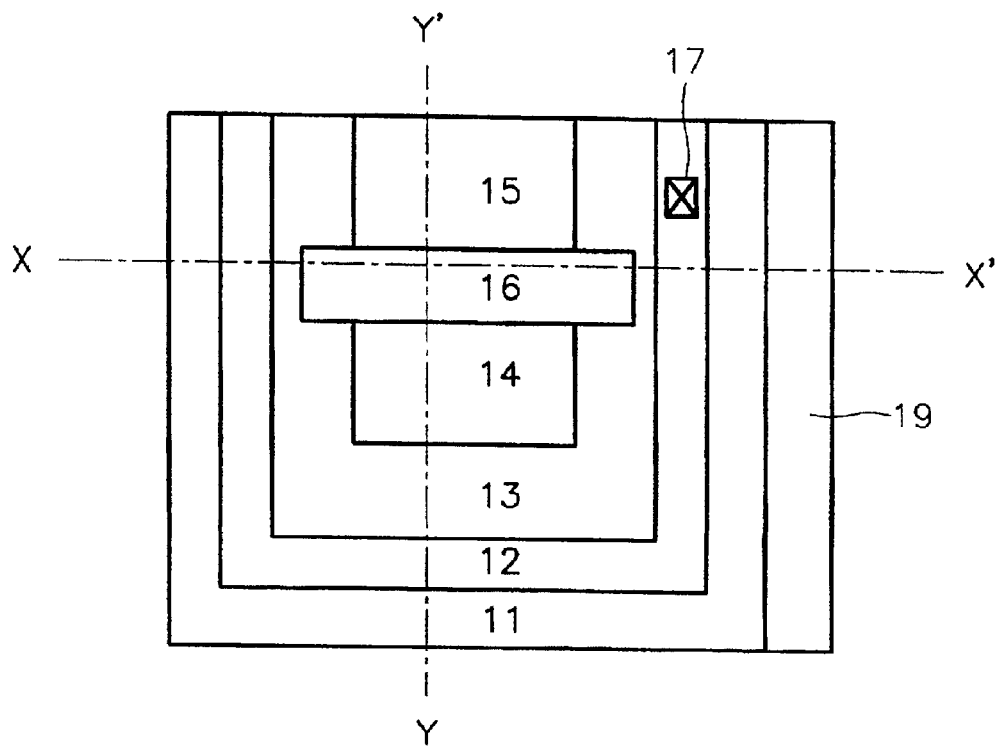
FIG. 1 is a plan view of a SOI MOSFET having a body contact according to a conventional trench method.
Figure 2:
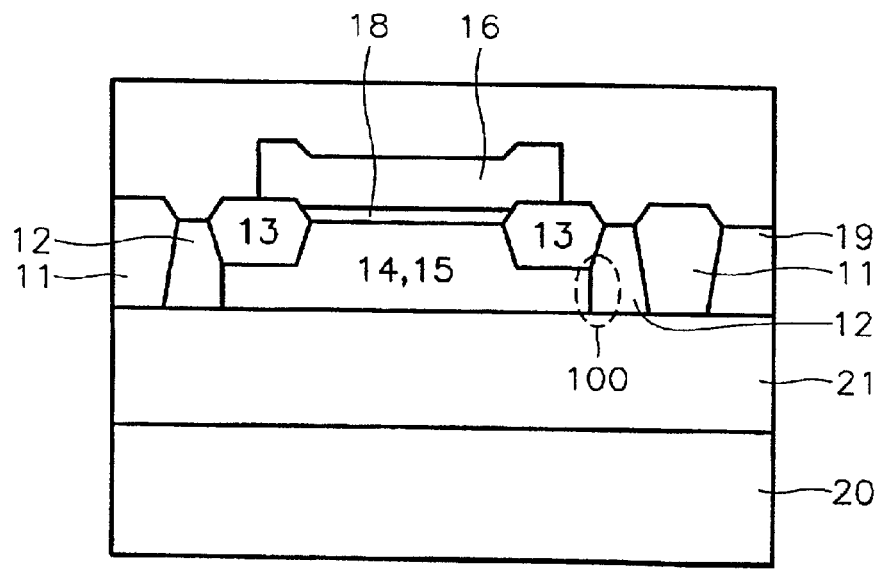
FIG. 2 is a cross-sectional view taken along line X—X of the SOI MOSFET shown in FIG. 1.
Figure 3:
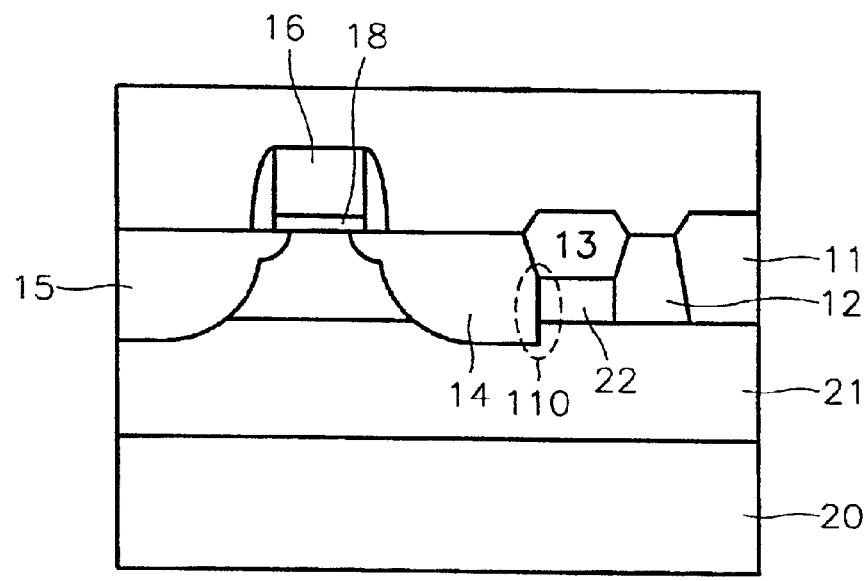
FIG. 3 is a cross-sectional view taken along line Y—Y of the SOI MOSFET shown in FIG. 1.
Figure 4:
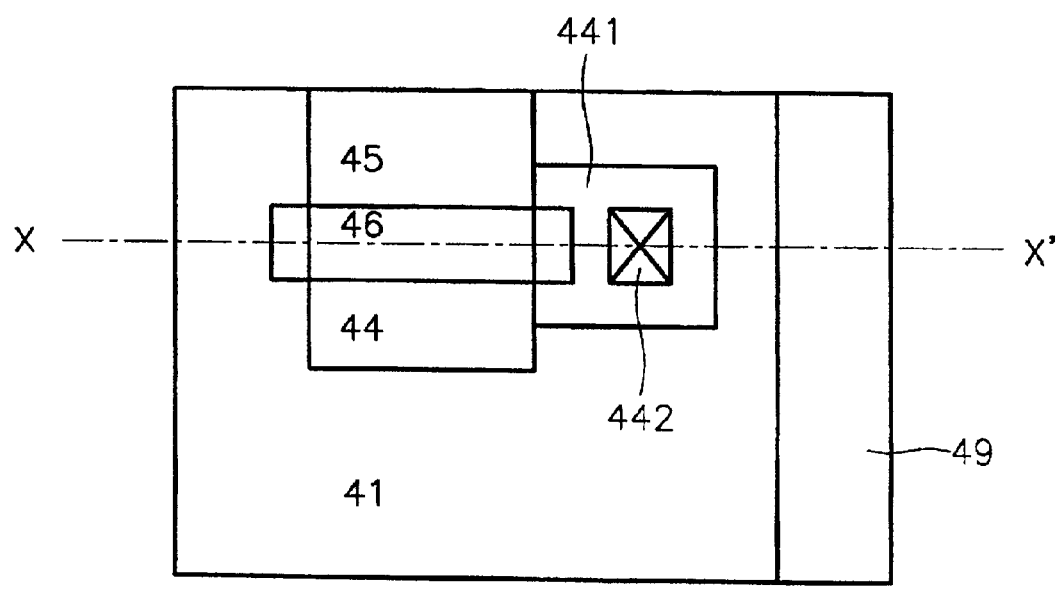
FIG. 4 is a plan view of a SOI MOSFET having a body contact according to an embodiment of the present invention.
Figure 5:
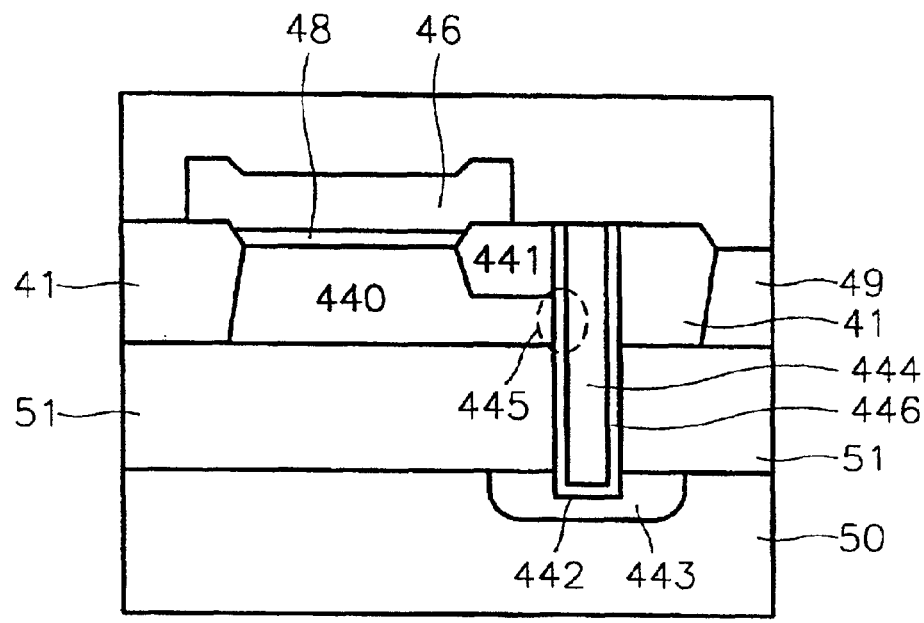
FIG. 5 is a cross-sectional view taken along line X—X of the SOI MOSFET shown in FIG. 4.

FIG. 4 is a plan view of a SOI MOSFET having a body contact according to one embodiment of the present invention, and FIG. 5 is a cross-sectional view taken along line X—X of the SOI MOSFET shown in FIG. 4. Referring to FIGS. 4 and 5, the SOI MOSFET according to the present invention includes a gate 46, a source 45, a drain 44, isolation regions 41, a p⁻ body 440, a field oxide layer region 441, and a body contact 442. Here, the body contact 442 is formed in the field oxide layer region 441 to directly connect a body divided into the source 45 and the drain 44 to a p⁻ semiconductor substrate 50. A peripheral active region 49 is an active region.

FIG. 5 shows a p⁻ semiconductor substrate 50, a buried oxide layer 51 on the p⁻ semiconductor substrate 50, a p⁻ body 440 on the buried oxide layer 51, isolation regions 41 next to the p⁻ body 440, a gate oxide layer 48 on the p⁻ body 440, a gate 46 on the gate oxide layer 48, a field oxide layer region 441 on one side of the p⁻ body 440, a body contact 442 contacting the field oxide layer region 441, a p⁺ region 443 into which impurity ions are implanted to form an ohmic contact when the p⁻ body 440 connects to the p⁻ semiconductor substrate 50, a metal 446 with which the body contact 442 is doped, and tungsten 444 on the metal 446.

Here, a region 445 is a contact which connects the p⁻ body 440 to the p⁺ region 443. A peripheral active region 49 is an external active region.

Referring to FIGS. 4 and 5, in the SOI MOSFET according to the present invention, power for the semiconductor substrate 50 is supplied to the p⁻ body 440 through the body contact 442, which is filled with materials, i.e., tungsten 444 and a metal 446, having high electrical conductivity. Thus, there is no need to use an additional metal line to prevent a floating body effect of the p⁻ body 440. Also, stray capacitance does not occur in region 445. In order to prevent the floating body effect, the body contact 442 has an area smaller than a metal line. Thus, the chip size is reduced.

Figure 6:
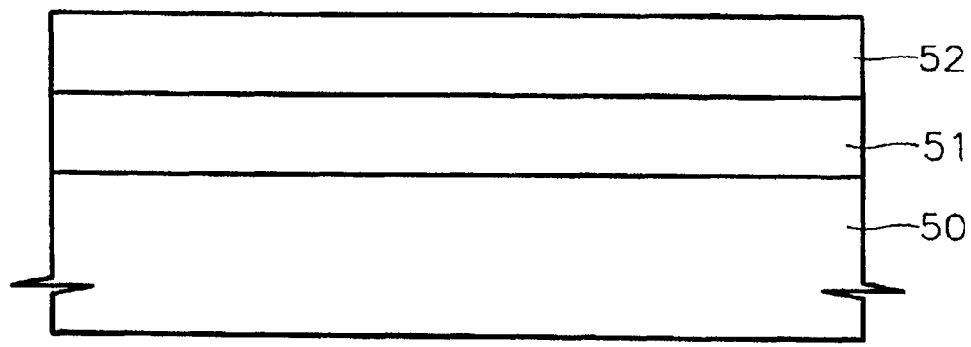
FIGS. 6 through 9 are cross-sectional views showing steps of fabricating the SOI MOSFET shown in FIGS. 4 and 5 according to the present invention.

FIGS. 6 through 9 are cross-sectional views showing steps of fabricating the SOI MOSFET shown in FIGS. 4 and 5 according to an embodiment of the present invention. Referring to FIG. 6, a buried oxide layer 51 and a silicon body 52 are formed on a semiconductor substrate 50.

Figure 7:
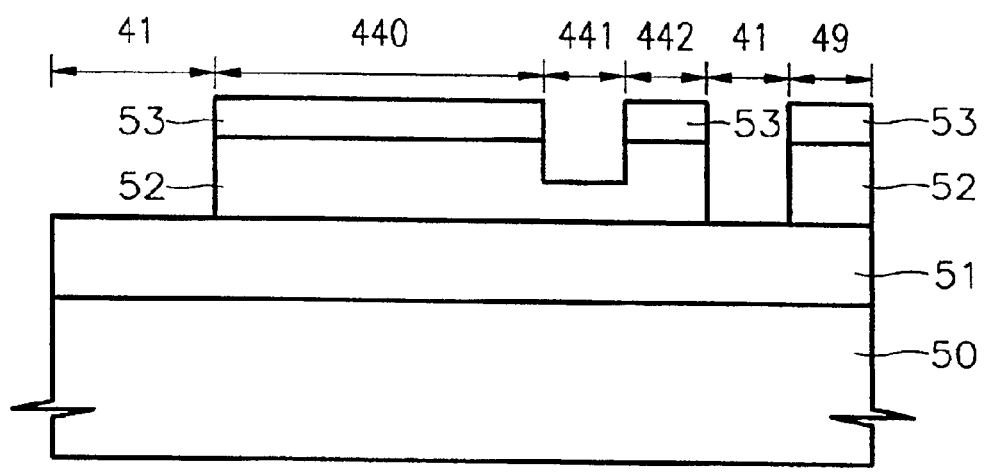

With reference to FIG. 7, a trench mask layer 53 is formed on the silicon body 52 and a photoresist (not shown) is deposited on the trench mask layer 53. The silicon body 52 is etched to form isolation regions 41, a p⁻ body or channel region 440, a field oxide layer region 441, a body contact 442, and a peripheral active region 49 using the photoresist as a mask. Here, the isolation regions 41 and the field oxide layer region 441 are etched to predetermined depths. The trench mask layer 53 may be a pad oxide layer, a pad nitride layer, or a hard mask layer.

Figure 8:
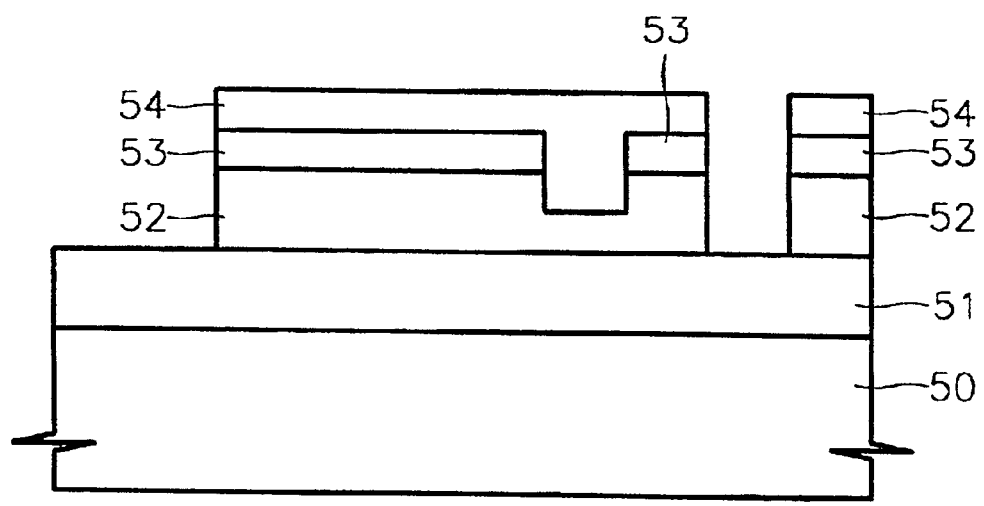

Referring to FIG. 8, the isolation regions 41 are etched to the buried oxide layer 51. Here, a photoresist 54 is deposited to protect other regions from being etched.

Figure 9:
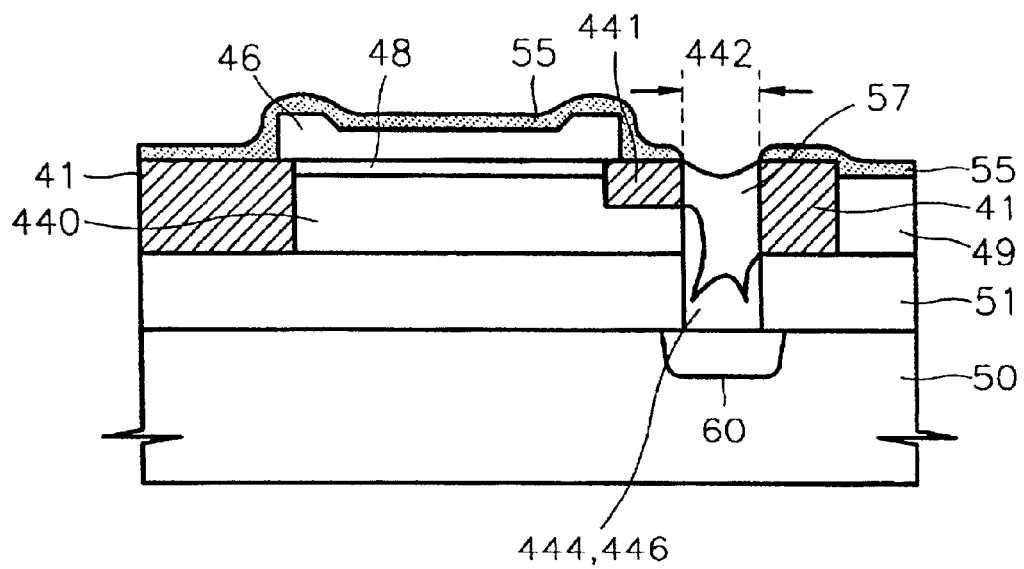

With reference to FIG. 9, oxide layers (regions indicated by slanted lines) are formed in the isolation regions 41 and the field oxide layer 441. A gate oxide layer 48 and a gate 46 are sequentially formed on the channel region 440 and on portions of the oxide layers formed in the isolation regions 41 and the field oxide layer region 441 in contact with both sides of the channel region 440.

Here, the oxide layers (regions indicated by slanted lines) are preferably made by chemical vapor deposition (CVD). The oxide layers are completed by a planarization process, such as etch back or chemical mechanical polishing. The gate oxide layer 48 is a thermal oxide layer.

The gate 46 is preferably a stack of a conductive layer (not shown) and a capping insulator (not shown). However, the gate 46 may be a conductive layer only. The conductive layer is formed of polysilicon or metal, and the capping insulator is formed of CVD oxide or silicon nitride made by CVD.

Referring to FIG. 9, an oxide layer 55 is formed on an entire wafer surface. A trench is formed from the body contact 442 to the semiconductor substrate 50, and then predetermined impurity ions are implanted into a predetermined region of the substrate, i.e., the bottom of the trench, thereby forming an ohmic region 60. The oxide layer 55 serves as a buffer and relieves stress in the ion implantation process.

The trench is filled with conductive materials on which an oxide layer 57 is formed. The conductive materials are preferably formed of metal, tungsten, a silicon epitaxial layer, and a combination of at least two of these.

Figure 10:
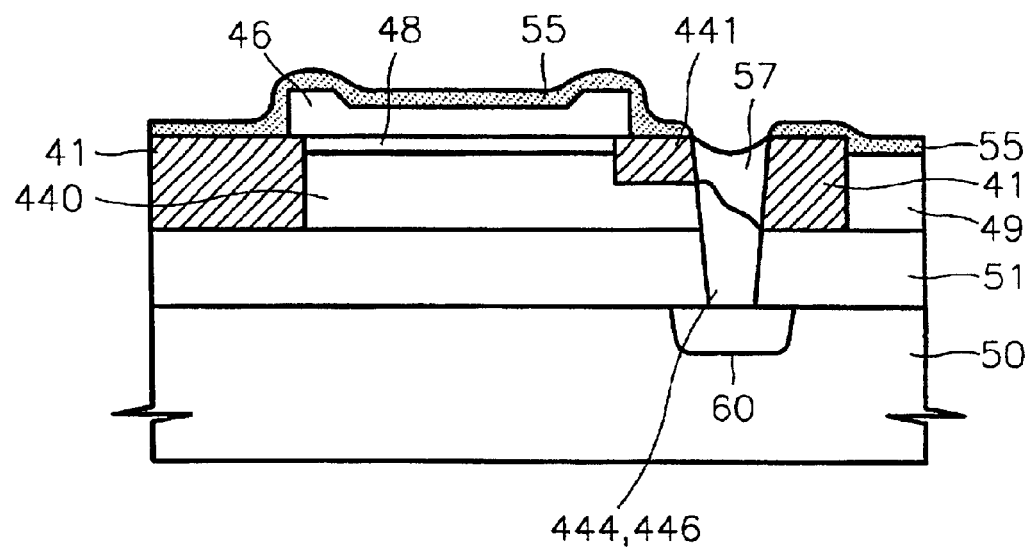
FIG. 10 shows a trench having an inverted trapezoid shape.

FIG. 10 shows a trench having an inverted trapezoid shape. Referring to FIG. 10, the trench narrows as it deepens, thereby preventing voids between the conductive materials and the oxide layer 57 formed on the conductive materials.

Figure 11:
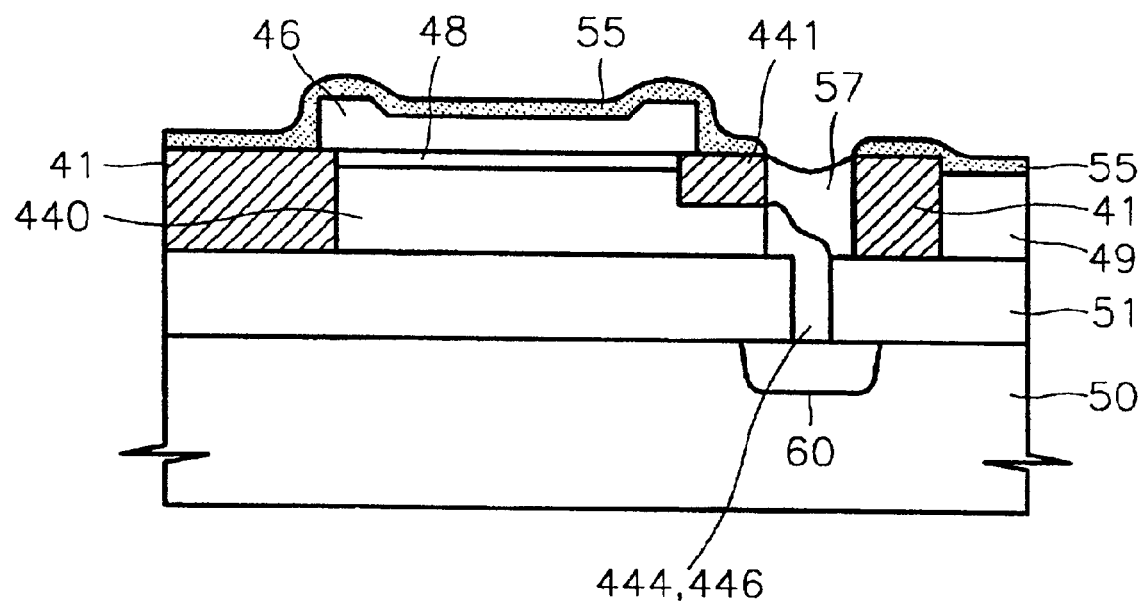
FIG. 11 shows a trench having a step shape.

FIG. 11 shows a trench having a step shape. Referring to FIG. 11, as the trench deepens, it narrows in a step-wise manner, thereby preventing voids between the conductive materials and the oxide layer 57 formed on the conductive materials. A first trench is formed to a predetermined depth, and then a second trench smaller than the first trench is formed underneath the first trench.

As described above, in the SOI MOSFET according to the present invention, an additional metal interconnection line for supplying a body with power is not needed. Thus, used area is reduced and the malfunction of a circuit due to stray capacitance of a contact is prevented.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A silicon-on-insulator metal oxide semiconductor field effect transistor (SOI MOSFET) comprising:
   a semiconductor substrate;
   a buried oxide layer formed on the semiconductor substrate;
   a body on the buried oxide layer, the body being an active region of a transistor;
   a gate oxide layer formed on the body;
   a gate formed on the gate oxide layer;
   an isolation region adjacent to and at least partially surrounding the body; and
   a body contact supplying power to the body,
   a field oxide region formed in the isolation region, the field oxide region at least partially surrounding the body contact;
   wherein the body contact is formed by forming a trench that perforates the isolation region, the field oxide region, the body, and the buried oxide layer and filling the trench with a conductive material so that the body is electrically connected to the semiconductor substrate, the conductive material including a combination layer of at least two layers selected fomr the group consisting of a metal layer, a tungsten layer and a silicon epitaxial layer.

2. The SOI MOSFET of claim 1, wherein the gate is formed of at least one material selected from the group consisting of metal and polysilicon.

3. The SOI MOSFET of claim 1, further comprising a region into which predetermined impurity ions are implanted and generated on the semiconductor substrate in contact with the lower portion of the body contact so that an ohmic contact is formed between the body contact and the semiconductor substrate.

4. The SOI MOSFET of claim 1, wherein the trench narrows as the trench deepens.

5. The SOI MOSFET of claim 4, wherein the trench narrows in a step-wise manner as the trench deepens.

* * * * *